United States Patent [19]
Kawasaki et al.

[11] Patent Number: 5,243,200
[45] Date of Patent: Sep. 7, 1993

[54] SEMICONDUCTOR DEVICE HAVING A SUBSTRATE RECESS FORMING SEMICONDUCTOR REGIONS

[75] Inventors: Hideshi Kawasaki, Yamato; Hiroyuki Tokunaga, Kawasaki, both of Japan

[73] Assignee: Canon Kabushiki Kaisha, Tokyo, Japan

[21] Appl. No.: 795,805

[22] Filed: Nov. 21, 1991

[30] Foreign Application Priority Data

Nov. 22, 1990 [JP] Japan ................... 2-319511

[51] Int. Cl.⁵ ............... H01L 21/20; H01L 21/31
[52] U.S. Cl. ............................. 257/99; 437/89; 437/110; 257/52; 257/79
[58] Field of Search ................ 357/68; 437/83, 89, 437/110, 915; 257/52, 79, 99

[56] References Cited

U.S. PATENT DOCUMENTS

| | | | |
|---|---|---|---|
| 3,411,051 | 11/1968 | Kilby | 317/235 |
| 4,983,539 | 1/1991 | Yamagata et al. | 437/110 |
| 5,045,907 | 9/1991 | Solomon | 357/32 |
| 5,103,851 | 4/1992 | Nishida et al. | 437/89 |

FOREIGN PATENT DOCUMENTS

| | | |
|---|---|---|
| 0276959 | 8/1988 | European Pat. Off. . |
| 0281335 | 9/1988 | European Pat. Off. . |
| 0285358 | 10/1988 | European Pat. Off. . |
| 0288166 | 10/1988 | European Pat. Off. . |
| 0312401 | 4/1989 | European Pat. Off. . |
| 60-167439 | 8/1985 | Japan . |
| 63-237517 | 10/1988 | Japan . |
| 63-239933 | 10/1988 | Japan . |

Primary Examiner—Eugene R. LaRoche
Assistant Examiner—Viet Q. Nguyen
Attorney, Agent, or Firm—Fitzpatrick, Cella, Harper & Scinto

[57] ABSTRACT

A semiconductor device comprises a substrate, a recess formed on the substrate, a first conductive type semiconductor region and a second conductive type semiconductor region having an opposite conductive type to the first conductive type formed in the recess formed on the substrate, and wiring portions, wherein the surfaces of the substrate, the first conductive type semiconductor region and the second conductive type semiconductor region and are continuously on one plane, and the wiring portions connected respectively to the first conductive type semiconductor region and the second conductive type semiconductor region are formed on and in contact with the plane and are all substantially on the same plane and electrically independent from each other.

6 Claims, 11 Drawing Sheets

F I G. 3D
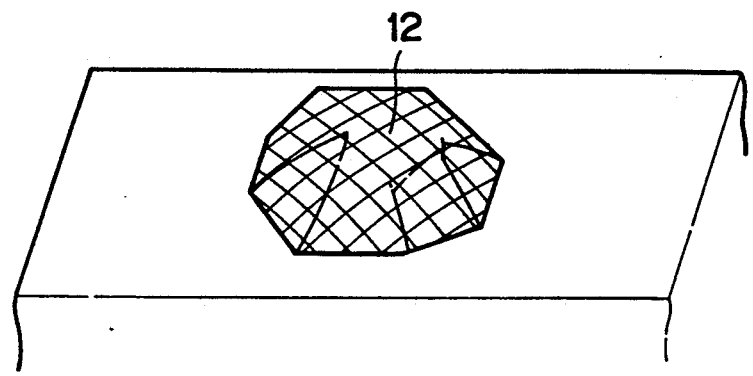
F I G. 3E
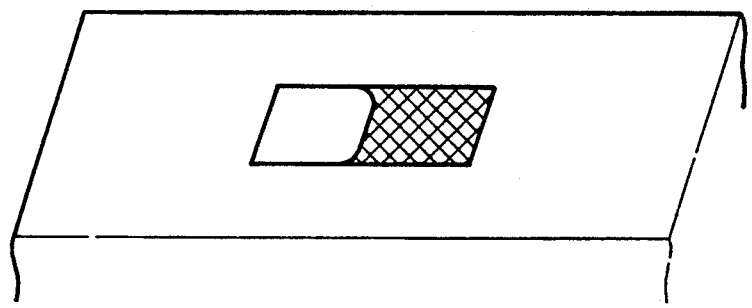
F I G. 3F
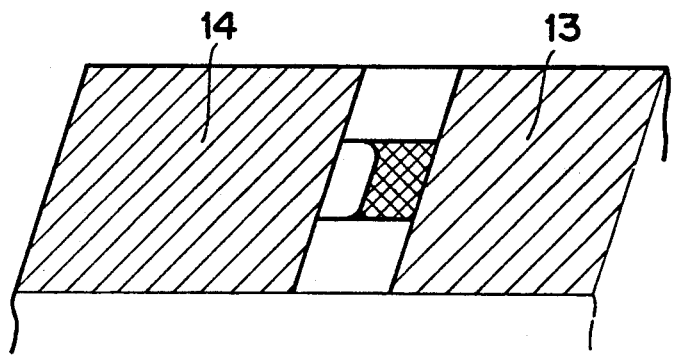

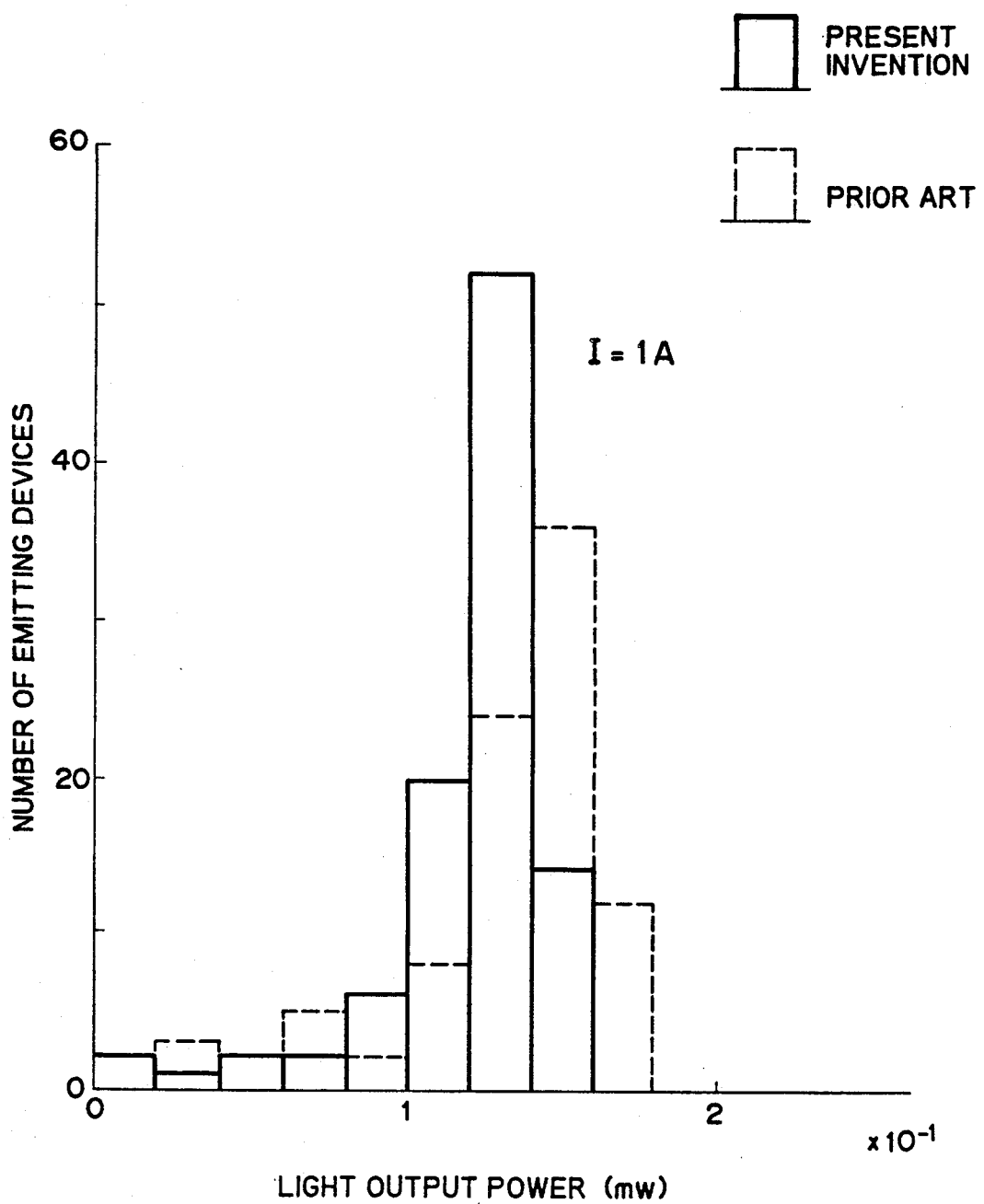

SEMICONDUCTOR DEVICE HAVING A SUBSTRATE RECESS FORMING SEMICONDUCTOR REGIONS

BACKGROUND OF THE INVENTION

1. Field of the Invention

This invention relates to a semiconductor device applied to a light-emitting device, an electronic device, etc. and a process for producing the semiconductor device.

2. Related Background Art

Heretofore, semiconductor devices of III–V group compounds such as GaAs, etc. have been formed by epitaxial growth on a substrate of GaAs monocrystal, but the epitaxial growth on such a monocrystalline substrate has been limited by materials of the monocrystalline substrate and it has been impossible to obtain a larger area and a three-dimensional integration. On the other hand, need for arrays of larger area or three-dimensional optical integrated circuits for use in light parallel processing, etc. are increasing and growth technique of monocrystal on an amorphous substrate is in keen demand. As one of the art of monocrystal growth on an amorphous substrate, a selective nucleation process is disclosed in Japanese Patent Application Laid-Open No. 63-237517, EP 0288166, etc.

The selective nucleation process is to apply a crystal growth treatment to a substrate having a free surface provided adjacent to an amorphous or polycrystalline non-nucleation surface having a low nucleation density and an amorphous or polycrystalline nucleation surface having a sufficiently small area for growth of crystals only from single nuclei and a larger nucleation density than that of the non-nucleation surface, thereby growing single monocrystals from the single nuclei.

FIG. 2 shows a semiconductor device obtained according to the selective nucleation process, wherein reference numeral 1 is a p side electrode, 2 is an insulating film, 3 is an n side electrode, 5 is a substrate, 6 is an n-type semiconductor, 7 is a p-type semiconductor and 8 is a seed crystal.

In the semiconductor device, an n side electrode 3 was overlapped with a p side electrode 1 through an insulating film 2 as shown in FIG. 2, conduction of the electrodes took place through pinholes of the insulating film or breaking of electrodes due to a level difference between the surface of substrate 5 and the device. Furthermore, there was a fluctuation in the resistance, resulting in fluctuations in the device characteristics, because one electrode was provided through one contact hole.

SUMMARY OF THE INVENTION

The present invention is to solve the above-described problems of the prior art.

According to the present invention, a recess is formed on a substrate, a p-type semiconductor and an n-type semiconductor are continuously formed from a monocrystal island on the bottom of the recess as a nucleus while controlling the location of the monocrystal island and growth time so that both p-type semiconductor and n-type semiconductor may be brought into contact with the side walls of recess and exposed above the substrate surface, and flattening of both p-type semiconductor and n-type semiconductor is carried out so that the surfaces of both semiconductors may be the same in level as the surface of substrate.

In the present invention, separation of the electrodes is not spatial one in the normal direction to the substrate through a thin insulating film, but a planar separation on the substrate surface and thus the problem of conduction between the electrodes can be solved and breaking of electrodes due to a level difference between the substrate surface and the device can be suppressed.

BRIEF DESCRIPTION OF THE DRAWINGS

FIGS. 3A to 3F show steps of producing an electronic device according to the present invention.

FIG. 5 is a diagram showing fluctuations in the device performance between the present invention and the prior art process.

DETAILED DESCRIPTION OF PREFERRED EMBODIMENTS

FIGS. 1A to 1H show steps of producing a semiconductor device according to one preferable embodiment of the present invention. The preferable embodiment is described below, referring to the steps shown in FIGS. 1A to 1H.

Figure 1A:
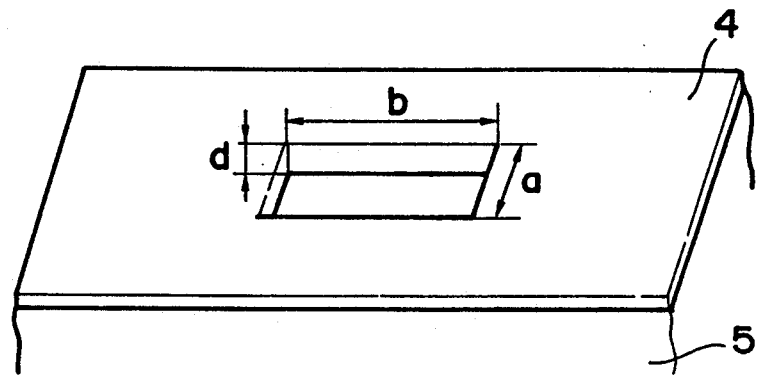
FIGS. 1A to 1H show steps of producing a semiconductor device according to the present invention.

FIG. 1A: A recess is formed on a heat-resistant substrate 5 such as a semiconductor monocrystal substrate such as a GaAs monocrystalline substrate, etc.; an amorphous substrate such as a quartz substrate and a ceramics substrate; or a high melting metal substrate such as a Ti substrate, W substrate, etc. The size of the recess, when the length of the shorter side is represented by a, the length of the longer side by b, and the depth by d, must be in such relations as generally $a < 100$ μm, $b < 200$ μm and $d < 50$ μm; preferably $a < 80$ μm, $b < 150$ μm and $d < 30$ μm; and more preferably $a < 50$ μm, $b < 100$ μm and $d < 20$ μm. The recess can be formed on the substrate surface, for example, by forming a pattern by photolithography, followed by wet etching or dry etching. Then, a non-monocrystal (non-nucleation surface) 4 having a low nucleation density of $SiO_2$ or $SiN_x$ is formed on the substrate surface by thermal oxidation treatment of the substrate surface, vapor deposition, sputtering, etc.

Figure 1B:
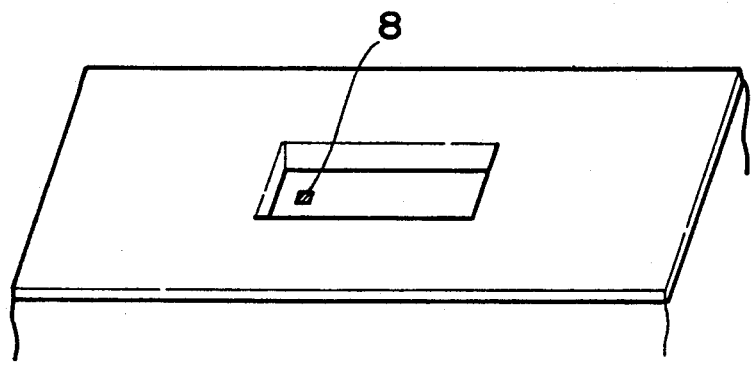
Figure 1C:
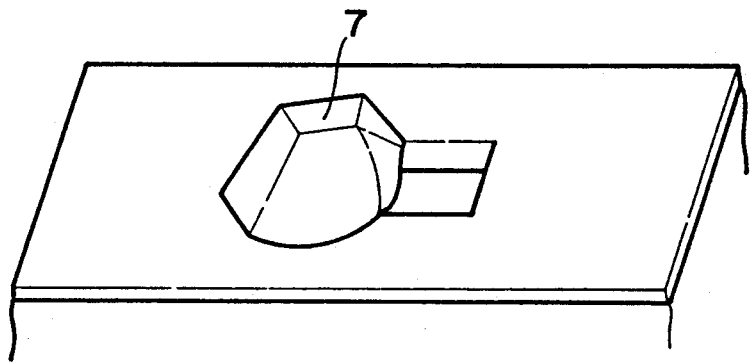
Figure 1D:
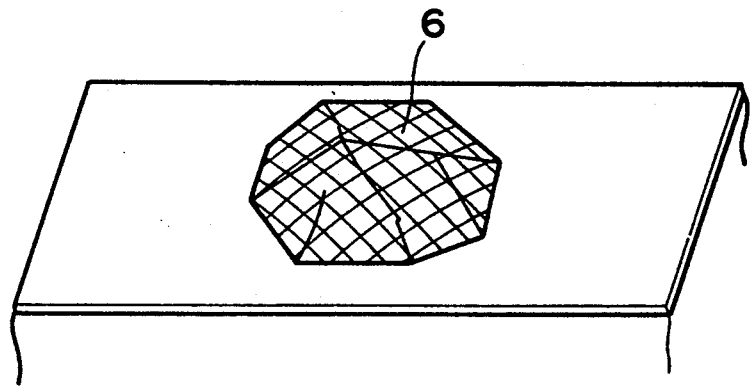
Figure 1E:
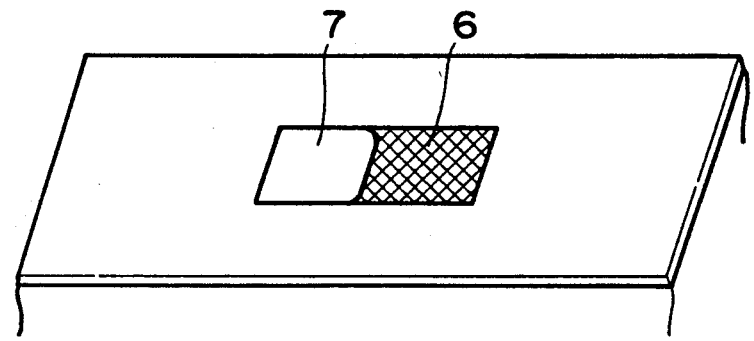
Figure 1F:
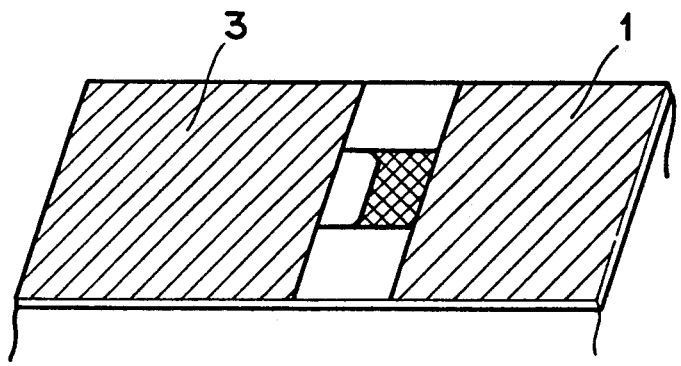
Figure 1G:
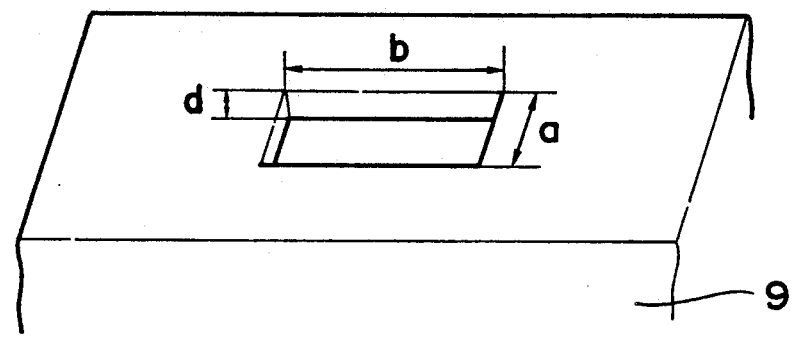

Alternatively, in place of the above step, pattern may be formed on a heat resistance substrate 9 such as a quartz, etc. which can become a non-nucleation surface to form only a recess on the substrate surface by a wet etching, a dry etching, etc. as shown in FIG. 1G.

The shape of recess is not limited to a rectangular shape, but may be in another shape.

FIG. 1B: Non-monocrystal of $Al_2O_3$, $Ta_2O_5$, etc. having a large nucleation density is formed on the non-monocrystal (non-nucleation surface) 4 of $SiO_2$, $SiN_x$, etc. by EB (electron beam) vapor deposition, resistance heating vapor deposition, etc. and then removed by RIBE (reactive ion beam etching), IBE (ion beam etching), etc., while leaving a fine region (nucleation surface) 8 of non-monocrystal at the bottom of the recess. The fine region is a square with sides of usually 10 μm, preferably 6 μm, and more preferably 2 μm. Alternatively, ions of Al, As, etc. may be implanted onto the bottom surface of the recess by FIB (focus ion beam) to form the nucleation surface, or ions of Al, As, etc. may be implanted onto the substrate surface while leaving a fine region on the bottom surface of the recess and masking other parts than the fine region, followed by removed of the mask, thereby increasing the nucleation density only in the fine region on the bottom surface of the recess.

When the recess is only in a circular shape, the position of the nucleation surface is outside the center, and when the recess is in another shape than the circular shape, the nucleation surface can take any position on the bottom surface of the recess.

Figure 1H:
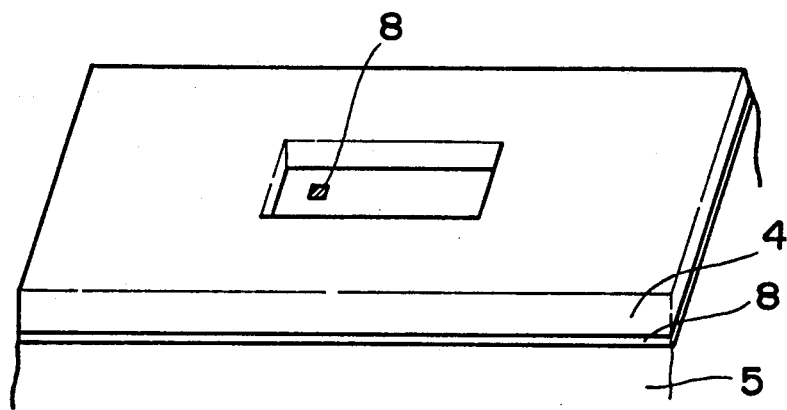
Figure 2:
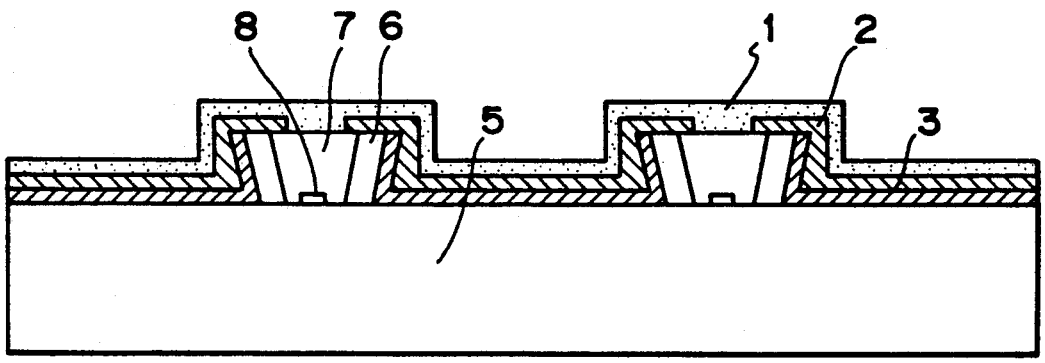
FIG. 2 shows the structure of a semiconductor device according to the prior art process.

Another method for forming a recess on the non-nucleation surface and forming a nucleation surface on the bottom surface of the recess may be a method as shown in FIG. 1H. That is, non-monocrystal 8 of $Al_2O_3$, $Ta_2O_5$, etc. having a large nucleation density is deposited on a heat-resistant substrate, and then non-monocrystal 4 of $SiO_2$ or $SiN_x$ is deposited thereon. Deposition can be made by EB vapor deposition, resistance heating vapor deposition, sputtering, etc. Then, a recess is formed so that the nucleation surface may not be exposed to the substrate surface, and the nucleation surface can be exposed by removing the non-nucleation surface on the bottom surface of the recess.

FIG. 1C: Semiconductor monocrystal is formed thereon by a selective nucleation process disclosed in Japanese Patent Application Laid-Open No. 63-237517 and EP 028816, utilizing a gas phase deposition and a difference in the nucleation density between the non-nucleation surface and the nucleation surface.

Then, n-type or p-type semiconductor 7 is made to grow on the semiconductor monocrystal as nucleus.

In this case, raw materials for semiconductor of group III–V compounds include TMG (trimethylgallium), TEG (triethylgallium), TMA (trimethylaluminum), TEA (triethylaluminum), TMIn (trimethylindium), TEIn (triethylindium), TBAs (t-butylarsine), TMAs (trimethylarsine), TEAs (triethylarsine), DMAs (dimethylarsine), DEAs (diethylarsine), $AsH_3$, TBP (t-butylphosphine), TMP (trimethylphosphine), TEP (triethylphosphine), $PH_3$, $NH_3$, etc. Doping raw materials include DMSe (dimethylselenium), DESe (diethylselenium), DMTe (dimethyltellurium), DETe (diethyltellurium), $SiH_4$, DEZn (diethylzinc), $Cp_2Mg$ (cyclopentamagnesium), $(MeCp)_2Mg$ (methylcyclopentamagnesium), etc.

Raw materials for semiconductor of group II–VI compounds include DMCd (dimethylcadmium), DECd (diethylcadmium), DMHg (dimethylmercury), DEHg (diethylmercury), TMSb (trimethylantimony), DMSe, DESe, MMTe, DETe, DMZn, DEZn, etc. Doping raw materials include TBP, TMP, $PH_3$, TMG, TEG, TMA, TEA, etc.

Raw materials for semiconductor of group IV compounds include $SiH_4$, $Si_2H_6$, $GeH_4$, $CH_4$, etc. Doping raw materials include TBP, TMP, $PH_3$, $B_2H_6$, etc.

Process for forming a semiconductor device by gas phase deposition is explained below.

Growth conditions are as follows. Growth temperature is 500° to 1,200° C. for the semiconductor of group III–V compounds, and 800° to 1,200° C. for nitrides. Growth temperature is 150° to 750° C. for semiconductor of group II–VI compounds and 800° C. to 1,200° C. for semiconductor of group IV compound. Pressure is usually not more than 80 Torr, preferably not more than 30 Torr, and more preferably not more than 20 Torr. Growth time is longer than the time until p-type or n-type semiconductor monocrystal reaches nearest recess periphery to the nucleation surface to fill up one of two portions of the recess periphery, divided at two points of the recess periphery and shorter than the time until all the recess is filled by the monocrystal.

FIG. 1D: n-Type or p-type semiconductor 6 having an opposite conductive type to that of the semiconductor formed as in FIG. 1C is made to grow thereon to fill the entire recess, while changing the doping raw material. Growth conditions are the same as in FIG. 1C.

FIG. 1E: Flattening is conducted down to the substrate surface by mechanical polishing with an abrasive material of Si, $Al_2O_3$, etc. or by mechanochemical polishing with bromomethanol, etc. to expose the interior of the device structure.

FIG. 1F: An electrode having an ohmic bonding with the p-type semiconductor is formed on the p-type semiconductor and another electrode having an ohmic bonding with the n-type semiconductor is formed on the n-type semiconductor by resistance heating vapor deposition, sputtering, EB (electron beam) vapor deposition, photolithography and etching, e.g. dry etching such as RIBE, IBE or wet etching or by lift-off, using metals 1 and 3 for the p-type semiconductor electrode and the n-type semiconductor electrode, respectively, thereby making a semiconductor device such as an electronic device or a light-emitting device.

The present semiconductor device can be also prepared as follows.

FIG. 1A: Recesses are formed on a semiconductor monocrystalline substrate 5 such as Si monocrystal substrate or GaAs monocrystal substrate. The size of the recesses, when the length of the shorter side is represented by a, that of the longer side by b, and the depth by d, must be in such relations as generally $a < 100$ μm, $b < 200$ μm and $d < 50$ μm; preferably $a < 80$ μm, $b < 150$ μm and $d < 30$ μm; and more preferably $a < 50$ μm, $b < 100$ μm and $d < 20$ μm. The recesses can be formed on the substrate surface by forming a pattern by photolithography, followed by wet etching, dry etching, etc. Then, a non-monocrystal 4 of $SiO_2$, $SiN_x$, etc. is formed on the substrate surface by thermal oxidation treatment of the substrate surface or vapor deposition or sputtering.

FIG. 1B: The fine region of non-monocrystal formed on the bottom of the recess is removed by dry etching, wet etching, etc. to expose the monocrystalline substrate as seed crystal 8.

FIG. 1C: n-Type or p-type semiconductor 7 is made to grow epitaxially thereon, utilizing the fine region exposed on the single monocrystalline substrate as seed crystal 8. In this case, as raw materials for semiconductor of compounds of various groups and the doping raw materials, the compound described above can be used in accordance with substrate materials.

FIG. 1D: Semiconductor 6 having an opposite conductive type to that of the semiconductor formed in FIG. 1C is made to grow epitaxially thereon to fill the entire recess, while changing the doping raw material.

FIGS. 1E and 1F: A semiconductor device is made in the same manner as mentioned above.

Example 1

This Example is described below referring to FIGS. 3A to 3F.

Figure 3A:
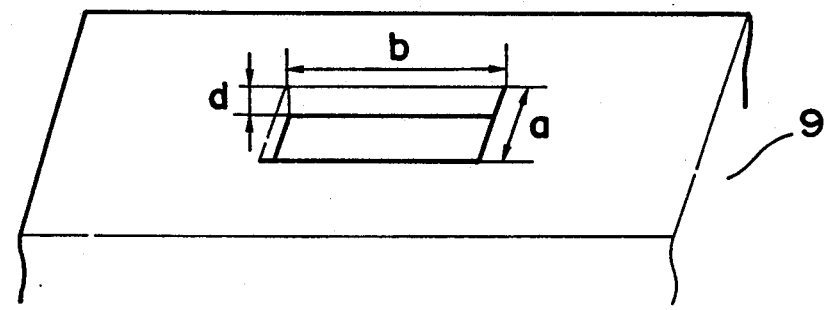

FIG. 3A: Recesses having a shorter side a=10 μm, a longer side b=20 μm and a depth d=5 μm is formed in a matrix state with intervals of 50 μm on the surface of SiO$_2$ substrate (non-nucleation surface) 9 by photolithography and wet etching with 2% fluoric acid.

Figure 3B:
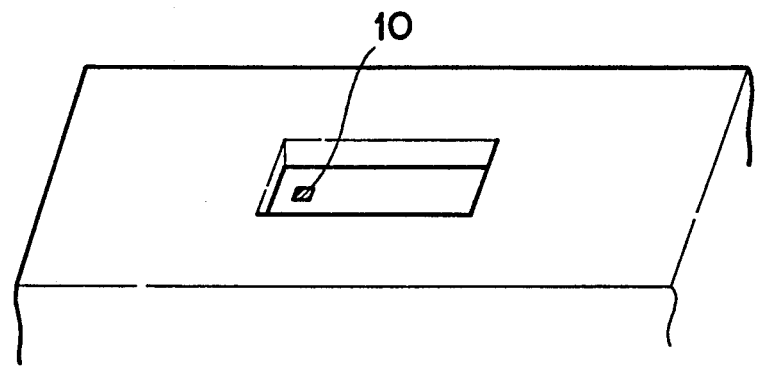

FIG. 3B: Then, Al$_2$O$_3$ (nucleation surface) 10 is formed thereon by EB (electron beam) vapor deposition. The vapor deposition is carried out in vacuum down to $1 \times 10^{-6}$ Torr while supplying oxygen (10 cc/min.) thereto, and fine regions 10 of Al$_2$O$_3$ (2 μm square) are formed at a position by 5 μm distant from the center in the direction to the shorter side on the bottom of recess by photolithography, and other region than the fine regions are removed by wet etching with an etching solution of H$_2$SO$_4$:H$_2$O$_2$:H$_2$O = 1:1:2.

Figure 3C:
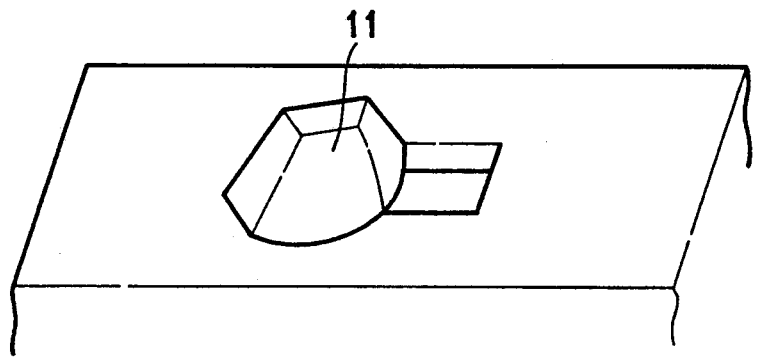

FIG. 3C: n-Type GaAs (n=$1 \times 10^{18}$ cm$^{-3}$) 11 is made to grow thereon by MOCVD by supplying TMG ($2.4 \times 10^{-5}$ mol/min.) and AsH$_3$ ($1.8 \times 10^{-5}$ mol/min.) as semiconductor raw materials, SiH$_4$ ($8.9 \times 10^{-6}$ mol/min.) as a doping raw material and H$_2$ (10 l/min.) as a carrier gas thereto at a substrate temperature of 670° C. under a pressure of 20 Torr for a growth time of 40 minutes.

FIG. 3D: p-Type GaAs (n=$1 \times 10^{18}$ cm$^{-3}$) 12 is made to grow thereon to fill the entire recess, while changing the doping raw material. The growth is carried out by supplying TMG ($2.4 \times 10^{-5}$ mol/min.) and AsH$_3$ ($1.8 \times 10^{-4}$ mol/min.) as semiconductor raw materials, DEZn ($1 \times 10^{-5}$ mol/min.) as a doping material, and H$_2$ (10 l/min.) as a carrier gas thereto at a growth temperature of 670° C. under a pressure of 20 Torr for a growth time of 50 minutes.

FIG. 3E: Flattening is carried out down to the substrate surface by mechanical polishing with an abrasive material of Si, Al$_2$O$_3$, etc. to expose the interior of device structure.

FIG. 3F: A Cr/Au electrode is formed on the p-type GaAs and an Au/Ge electrode on the n-type GaAs by resistance heating vapor deposition, sputtering, EB (electron beam) vapor deposition, photolithography and etching, e.g. dry etching such as RIBE or IBE, or wet etching, or lift-off, using metals 13 and 14 for Cr/Au electrode and AuGe electrode, respectively, to make a semiconductor device such as an electronic device, a light-emitting device, etc.

A GaAs diode is prepared in the manner as mentioned above, and the device characteristics are evaluated. 1.1% of the devices suffers from conduction and 3% thereof suffers from wire breaking. As compared with 2% of conduction-suffered devices and 5% wire breaking-suffered devices among those prepared according to the conventional process, those suffering from the conduction and those suffering from the wire breaking can be reduced approximately to a half.

Example 2

This Example is described below referring to FIGS. 4A to 4G.

Figure 4A:
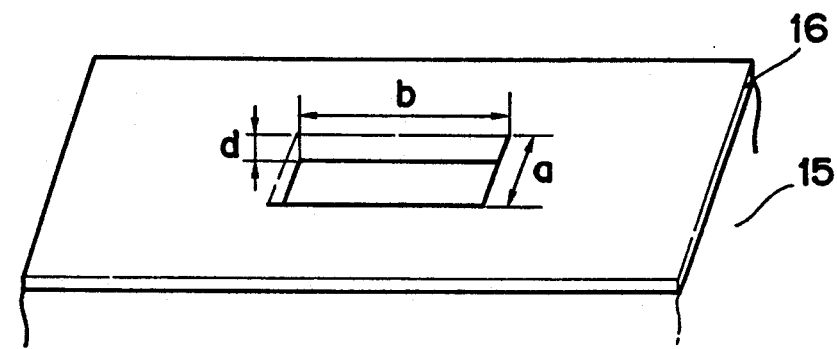
FIGS. 4A to 4G show steps of producing a light-emitting device according to the present invention.

FIG. 4A: Recesses having a shorter side a=10 μm, a longer side b=20 μm and a depth d=5 μm are formed at intervals 100 μm on the surface of Si substrate 15 by photolithography and dry etching with CF$_4$. Then, a SiO$_2$ film 16 having a film thickness of 1 μm is formed thereon by heat treatment in a steam atmosphere at 1,200° C. for 10 minutes.

Figure 4B:
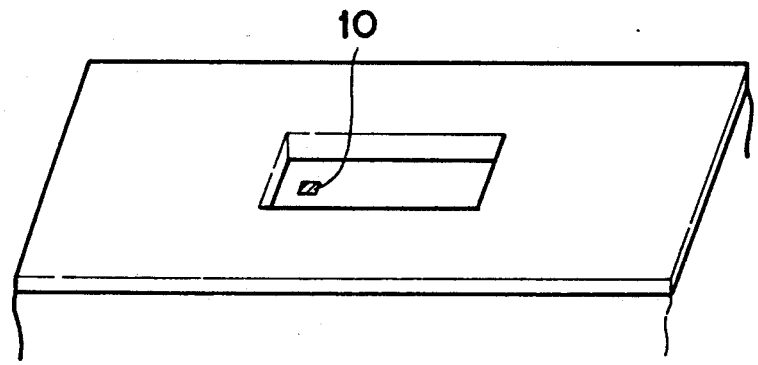
Figure 4C:
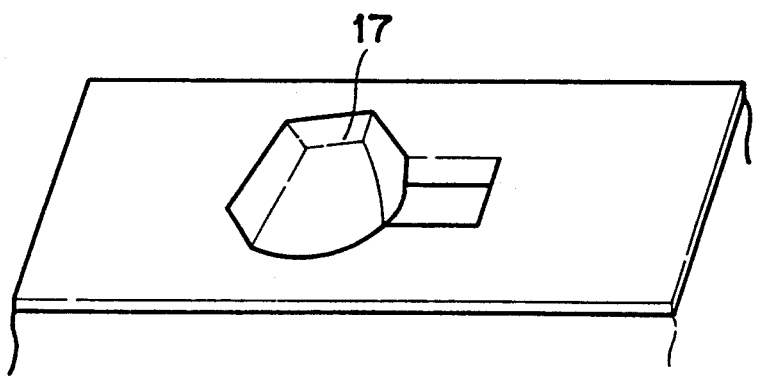

FIG. 4B: Then, Al$_2$O$_3$ (nucleation surface) 10 is formed on the bottoms of the recess by EB (electron beam) vapor deposition in vacuum down to $1 \times 10^{-5}$ Torr, while supplying an oxygen gas (10 cc/min.) thereto. Then, a fine region (2 μm) of Al$_2$O$_3$ 10 is made at a position by 5 μm distant from the center in the direction to the shorter side on the bottom of the recess by photolithography, and other region than the fine region is removed by wet etching with an etching solution of H$_2$SO$_4$:H$_2$O$_2$:H$_2$O = 1:1:2.

4C: n-Type AlGaAs (n=$1 \times 10^{18}$ cm$^{-3}$) 17 is made to grow thereon by MOCVD by supplying TMG ($1.5 \times 10^{-5}$ mole/min.), TMA ($0.9 \times 10^{-5}$ mole/min.), AsH$_3$ ($1.8 \times 10^{-5}$ mole/min.) as semiconductor raw materials, SiH$_4$ ($8.9 \times 10^{-5}$ mole/min.) as a doping raw material and H$_2$ (10 l/min.) as a carrier gas thereto at a substrate temperature of 670° C. under a pressure of 20 Torr for a growth time of 40 minutes.

Figure 4D:
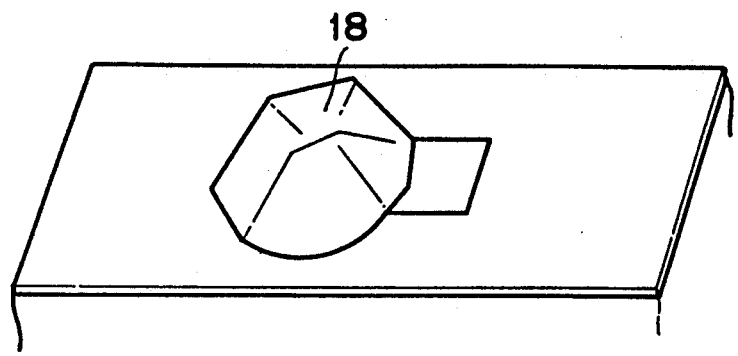

FIG. 4D: Then, GaAs 18 is made to grow thereon by supplying TMG ($2.4 \times 10^{-5}$ mole/min.), AsH$_3$ ($1.8 \times 10^{-4}$ mole/min.) and H$_2$ (10 l/min.) thereto at a growth temperature of 670° C. under a pressure of 20 Torr for a growth temperature of 3 minutes.

Figure 4E:
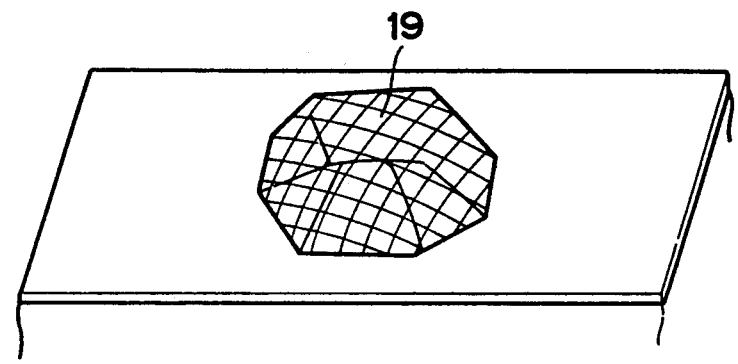

FIG. 4E: a p-Type AlGaAs (n=$1 \times 10^{18}$ cm$^{-3}$) 19 is made to grow thereon by supplying TMG ($1.5 \times 10^{-5}$ mole/min.), TMA ($0.9 \times 10^{-5}$ mole/min.) and AsH$_3$ ($1.8 \times 10^{-5}$ mole/min.) as semiconductor raw materials, DEZn ($8.9 \times 10^{-6}$ mole/min.) as a doping raw material and H$_2$ (10 l/min.) as a carrier gas thereto at a substrate temperature of 670° C. under a pressure of 20 Torr for a growth time of 50 minutes.

Figure 4F:
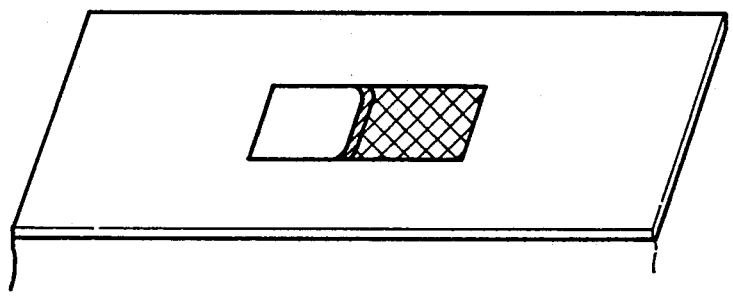

FIG. 4F: Flattening is carried out down to the substrate surface by mechanical polishing with an abrasive material of Si, Al$_2$O$_3$, etc. to expose the interior of the device structure.

Figure 4G:
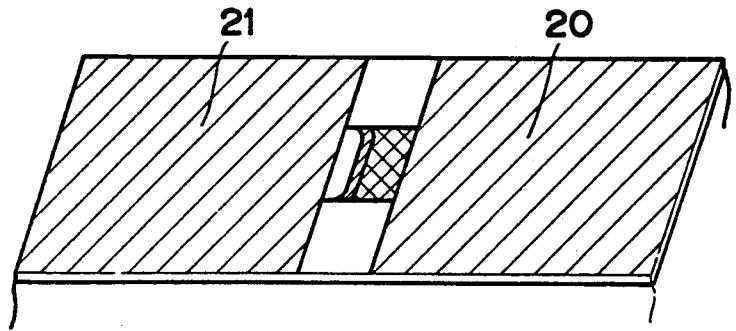

FIG. 4G: A Cr/Au electrode is formed on the p-type GaAs and an AuGe electrode on the n-type GaAs by resistance heating vapor deposition, sputtering, EB (electron beam) vapor deposition, photolithography and etching such as dry etching or wet etching or lift-off, using metals 20 and 21 for the Cr/Au electrode and the AuGe electrode, to make a light-emitting device.

Emitting characteristics of the thus prepared light-emitting device are evaluated and shown in FIG. 5, together with those of a light-emitting device prepared according to the conventional method. Device characteristics of the conventional light-emitting device are fluctuated due to fluctuations in contact resistance, whereas fluctuations in the emission intensity can be suppressed according to the present invention as shown in FIG. 5.

Example 3

This Example is described below referring to FIGS. 6A to 6F.

Figure 6A:
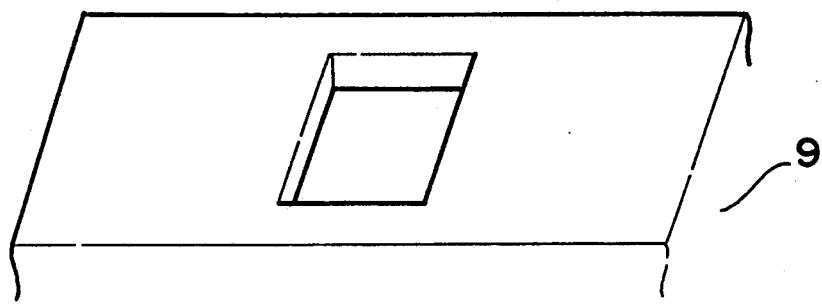
FIGS. 6A to 6F show steps of producing an electronic device according to the present invention.

FIG. 6A: Square recesses having sides of 10 μm and a depth of 5 μm are formed at intervals of 50 μm on the surface of a SiO$_2$ substrate (non-nucleation surface) 9 by photolithography and wet etching with 2% hydrofluoric acid.

Figure 6B:
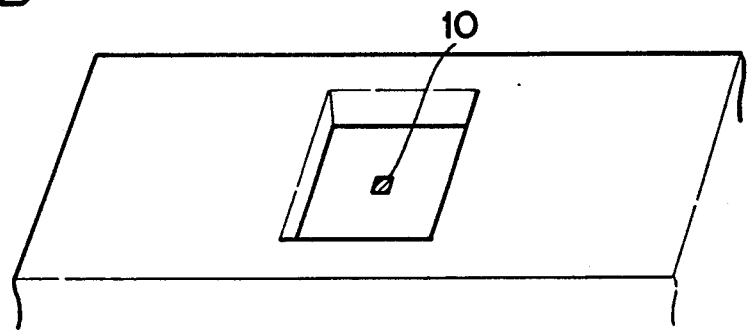

FIG. 6B: Then, Al$_2$O$_3$ (non-nucleation surface) 10 is formed on the bottom of the recess by EB (electron beam) vapor deposition in vacuum down to $1 \times 10^{-6}$ Torr, while supplying oxygen (10 cc/min.) thereto. A fine region of Al$_2$O$_3$ 10 is formed at the center of the bottom of recess by photolithography and other regions than the fine regions are removed by wet etching with an etching solution of H$_2$SO$_4$:H$_2$O$_2$:H$_2$O = 1:1:2.

Figure 6C:
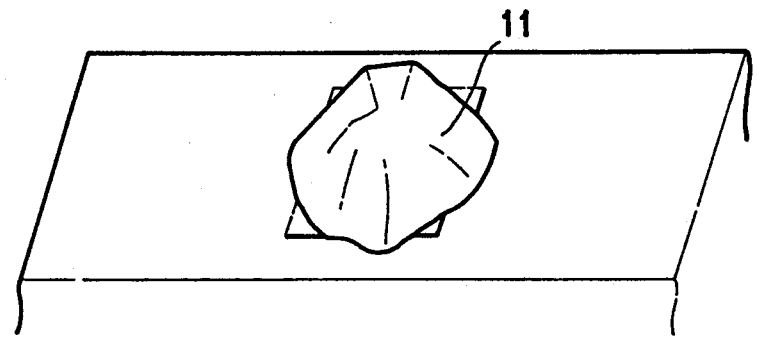

FIG. 6C: n-Type GaAs (n=$1 \times 10^{18}$ cm$^{-3}$) 11 is made to grow on the bottom of the recess by MOCVD supplying TMG ($2.4 \times 10^{-5}$ mole/min.) and AsH$_3$ ($1.8 \times 10^{-5}$ mole/min.) and SiH$_4$ ($8.9 \times 10^{-6}$ mole/min.) as a doping raw material and H$_2$ (10 l/min.) as a carrier gas thereto at a substrate temperature of 670° C. under a pressure of 20 Torr for a growth time of 30 minutes.

Figure 6D:
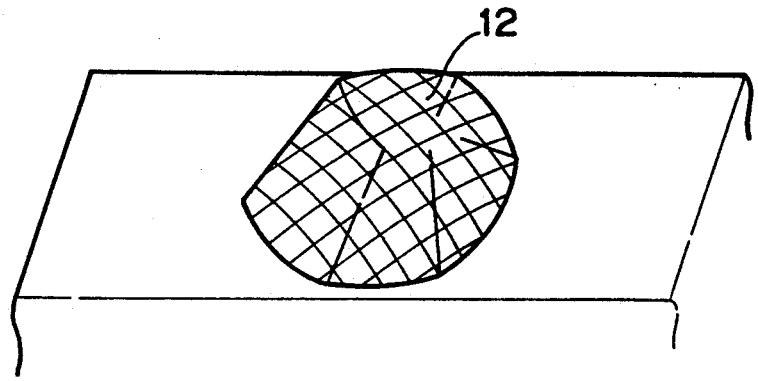

FIG. 6D: p-Type GaAs (n=$1 \times 10^{18}$ cm$^{-3}$) 12 is made to grow thereon to fill the entire recess, while changing the doping raw material. Growth is carried out by supplying TMG ($2.4 \times 10^{-5}$ mole/min.) and AsH$_3$ ($1.8 \times 10^{-4}$ mole/min.) as semiconductor raw materials, DEZn ($1 \times 10^{-5}$ mole/min.) as a doping raw material and H$_2$ (10 l/min.) at a growth temperature of 670° C. under a pressure of 20 Torr for a growth time of 20 minutes.

Figure 6E:
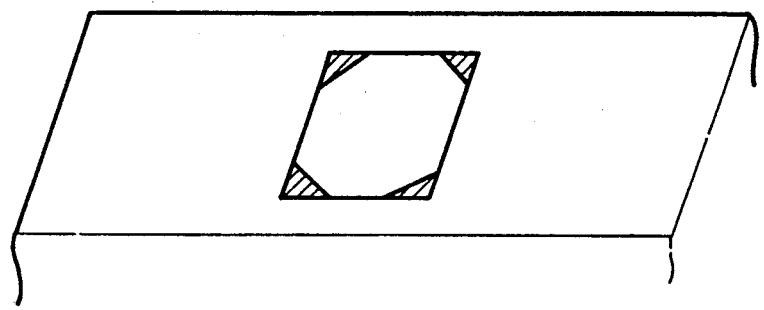

FIG. 6E: Flattening is carried out down to the substrate surface by mechanical polishing with an abrasive material such as Si, Al$_2$O$_3$, etc. to expose the interior of the device structure.

Figure 6F:
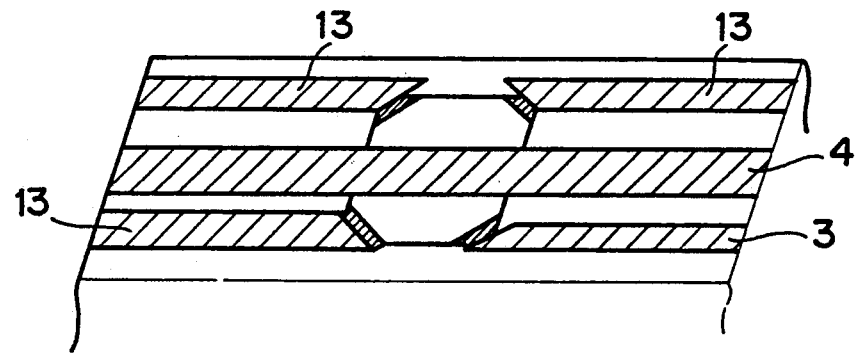

FIG. 6F: A Cr/Au electrode is formed on the p-type GaAs and an AuGe electrode on the n-type GaAs by resistance heating vapor deposition, sputtering, EB (electron beam) vapor deposition, photolithography and etching such as dry etching, i.e. RIBE or IBE, or wet etching, or lift-off, using metals 13 and 14 for the electrodes of Cr/Au and AuGe, to make a semiconductor such as an electronic device or a light-emitting device.

Device characteristics of the thus prepared GaAs diode are evaluated. 1.6% of the devices suffer from conduction and 3.8% of the devices suffer from wire breaking in the present invention, whereas 2% of devices suffer from conduction and 5% suffer from wire breaking in case of devices prepared by the conventional method. Thus, the present invention can reduce conduction and wire breaking of the devices.

We claim:

1. A semiconductor device comprising a substrate, having a recess formed thereon, in which are formed a first conductive type semiconductor region, and a second conductive type semiconductor region having an opposite conductive type to said first conductive type and being in contact with said first conductive type semiconductor region and wiring portions connected respectively to said first conductive type semiconductor region and electrically independent from each other which are formed in said recess formed on the substrate;

wherein the substrate surface is in contact with each surface of said first conductive type semiconductor region and said second conductive type semiconductor region so that the surfaces of said substrate and said first and second conductive type semiconductor regions are continuously on one same plane, and the wiring portions are all formed on the same plane and in contact with said plane.

2. The semiconductor device according to claim 1, wherein the semiconductor regions comprise a semiconductor of group III-V compounds.

3. The semiconductor device according to claim 1, wherein the semiconductor regions comprise a semiconductor of group II-VI compounds.

4. The semiconductor device according to claim 1, wherein the semiconductor regions comprise a semiconductor of group IV compounds.

5. The semiconductor device according to claim 1, wherein the recess has a shape other than a circular shape.

6. The semiconductor device according to claim 1, wherein the recess has a circular shape and has a nucleation surface at a position other than the center of the bottom of the recess.

* * * * *

UNITED STATES PATENT AND TRADEMARK OFFICE
CERTIFICATE OF CORRECTION

PATENT NO. : 5,243,200
DATED : September 7, 1993
INVENTOR(S) : HIDESHI KAWASAKI, ET AL.

It is certified that error appears in the above-identified patent and that said Letters Patent is hereby corrected as shown below:

COLUMN 2
    Line 4, "not" should read --not a--.
    Line 52, "pattern" should read --a pattern--.

COLUMN 3
    Line 7, "removed" should read --removal--.

COLUMN 4
    Line 3, "reaches" should read --reaches the--.

COLUMN 6
    Line 68, "supplying" should read --by supplying--.

COLUMN 8
    Line 10, "substrate;" should read --substrate,--.

Signed and Sealed this

Sixteenth Day of May, 1995

Attest:

BRUCE LEHMAN

Attesting Officer     Commissioner of Patents and Trademarks